(12) United States Patent
Xie et al.

(10) Patent No.: US 9,142,651 B1
(45) Date of Patent: Sep. 22, 2015

(54) METHODS OF FORMING A FINFET SEMICONDUCTOR DEVICE SO AS TO REDUCE PUNCH-THROUGH LEAKAGE CURRENTS AND THE RESULTING DEVICE

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 24 days.

(21) Appl. No.: 14/226,488

(22) Filed: Mar. 26, 2014

(51) Int. Cl.
| | |
|---|---|
| *H01L 21/336* | (2006.01) |
| *H01L 29/76* | (2006.01) |
| *H01L 29/66* | (2006.01) |
| *H01L 27/088* | (2006.01) |

(52) U.S. Cl.
CPC ...... *H01L 29/66818* (2013.01); *H01L 27/0886* (2013.01)

(58) Field of Classification Search
CPC ............. H01L 21/845; H01L 21/823431; H01L 27/0886; H01L 27/1211; H01L 29/66818; H01L 29/66545; H01L 29/66795; H01L 29/785

USPC ............... 438/151, 154, 155, 161, 197, 199; 257/368, 369, 401
See application file for complete search history.

(56) References Cited

U.S. PATENT DOCUMENTS

| | | | | |
|---|---|---|---|---|
| 8,921,178 | B2 * | 12/2014 | Manabe | 438/230 |
| 2014/0327090 | A1 * | 11/2014 | Cai et al. | 257/401 |
| 2014/0377918 | A1 * | 12/2014 | Cheng et al. | 438/163 |
| 2015/0102411 | A1 * | 4/2015 | Ching et al. | 257/347 |

OTHER PUBLICATIONS

Sasaki et al., "Conformal Doping for FinFETs and Precise Controllable Shallow Doping for Planar FET Manufacturing by a Novel B2H6/Helium Self-Regulatory Plasma Doping Process," Electron Devices Meeting, Jun. 2008.

* cited by examiner

*Primary Examiner* — Kevin M Picardat
(74) *Attorney, Agent, or Firm* — Amerson Law Firm, PLLC

(57) ABSTRACT

One method disclosed includes, among other things, covering a top surface and a portion of the sidewalls of a fin with etch stop material, forming a sacrificial gate structure above and around the fin, forming a sidewall spacer adjacent the sacrificial gate structure, performing at least one process operation to remove the sacrificial gate structure and thereby define a replacement gate cavity, forming a counter-doped region in the fin below an upper surface of the fin and below the channel region of the device, wherein the counter-doped region is doped with a second type of dopant material that is of an opposite type relative to the first type of dopant material, and forming a replacement gate structure in the replacement gate cavity.

26 Claims, 17 Drawing Sheets

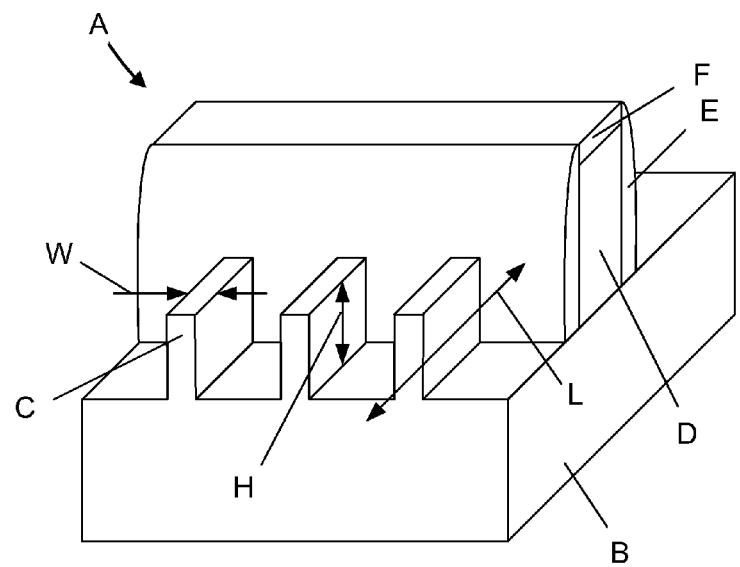
Figure 1A (Prior Art)
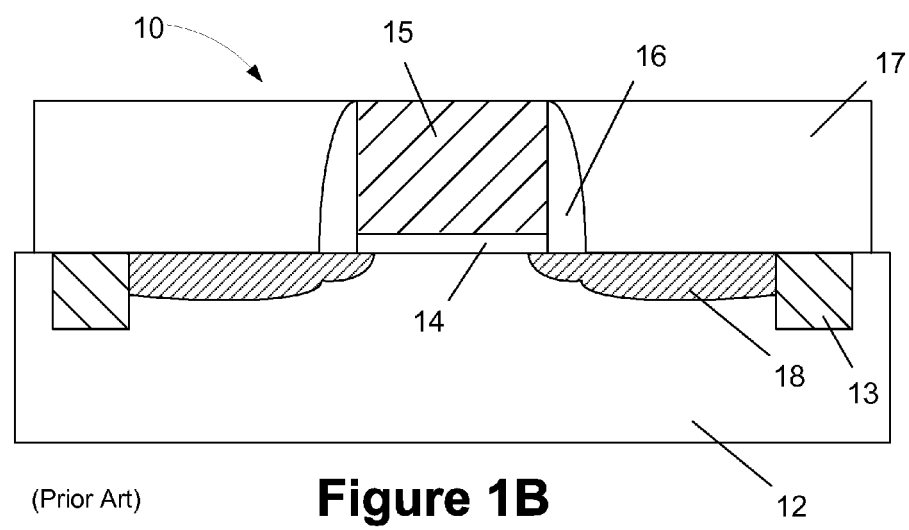
(Prior Art) Figure 1B

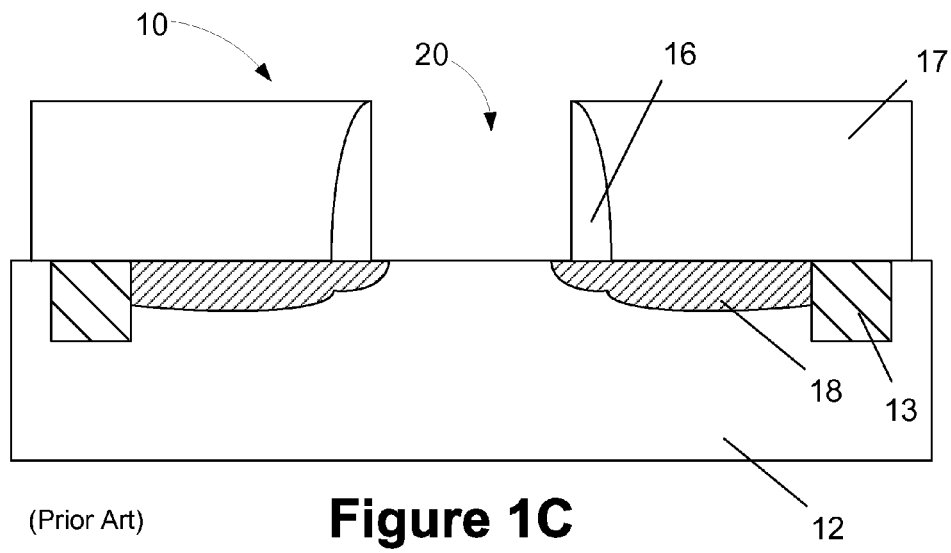
(Prior Art) Figure 1C
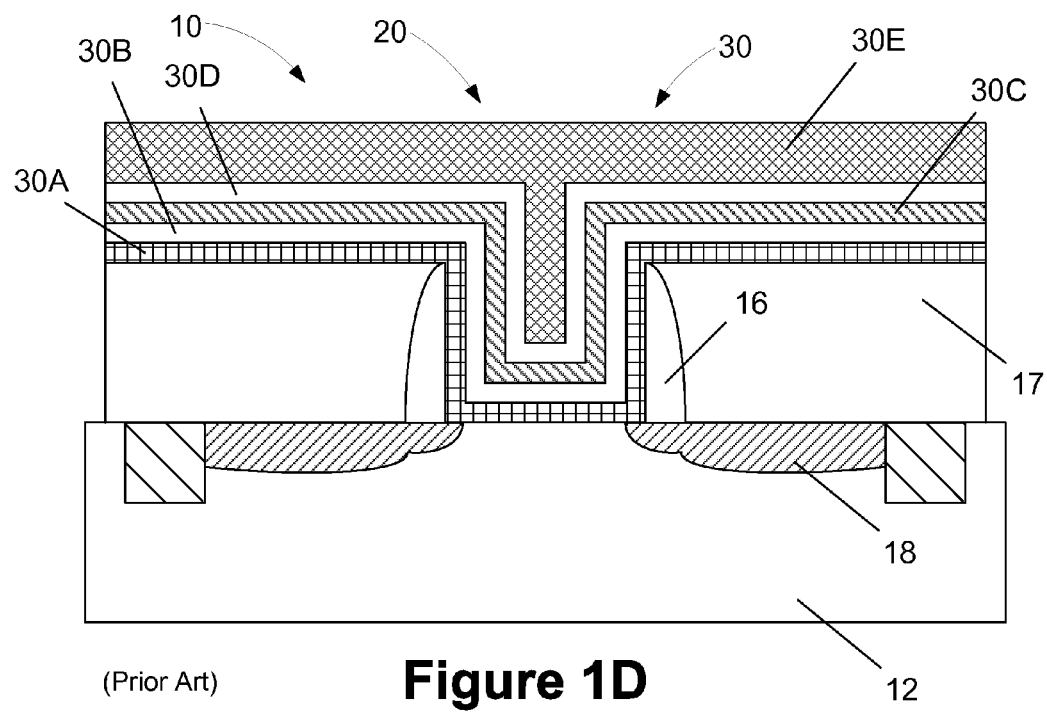
(Prior Art) Figure 1D

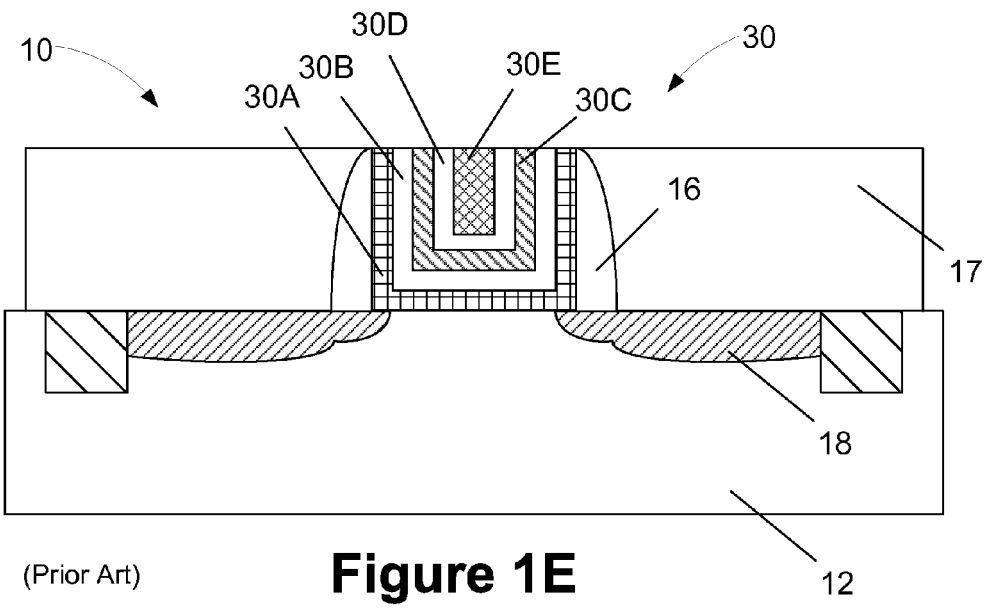
(Prior Art) Figure 1E
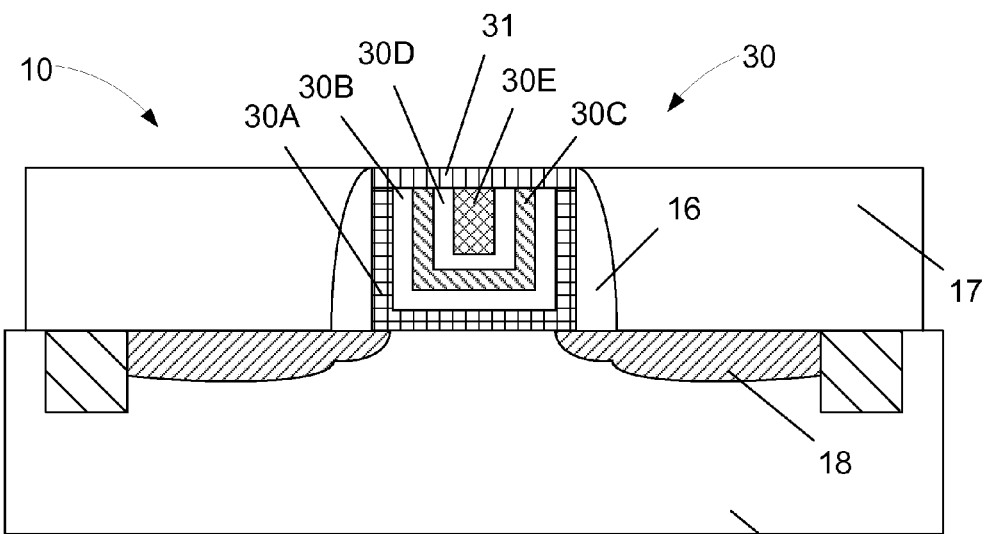
(Prior Art) Figure 1F

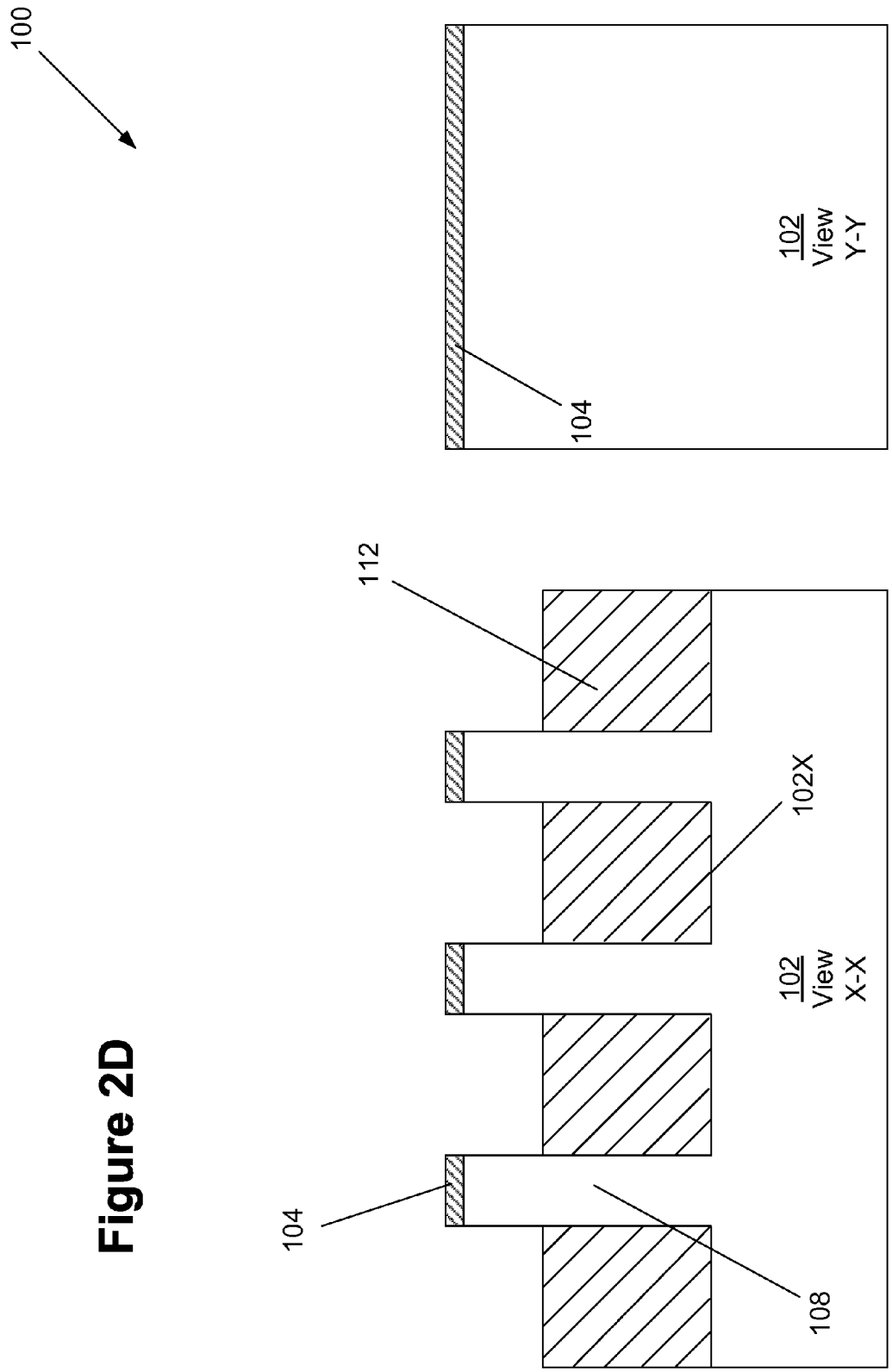

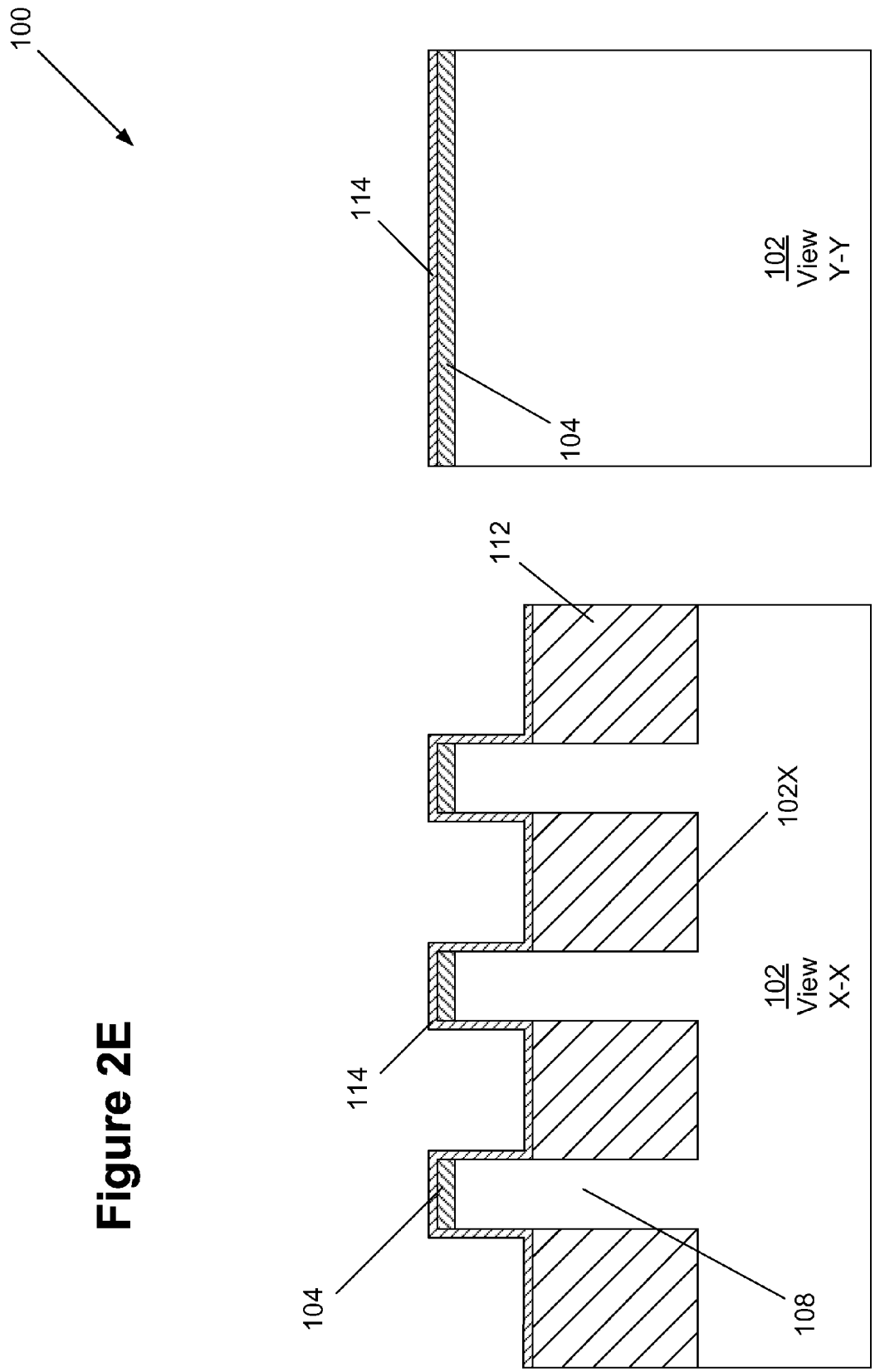

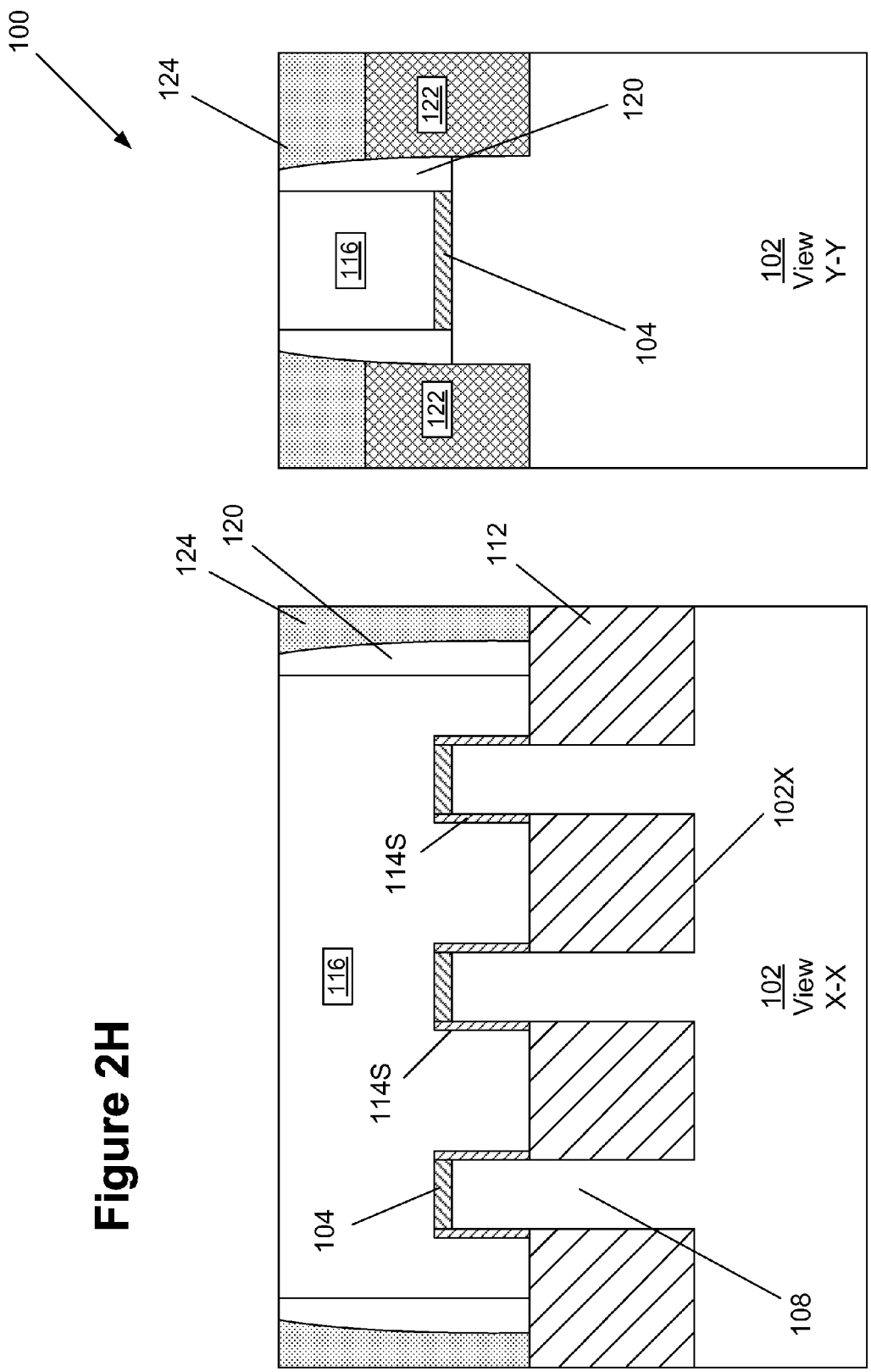

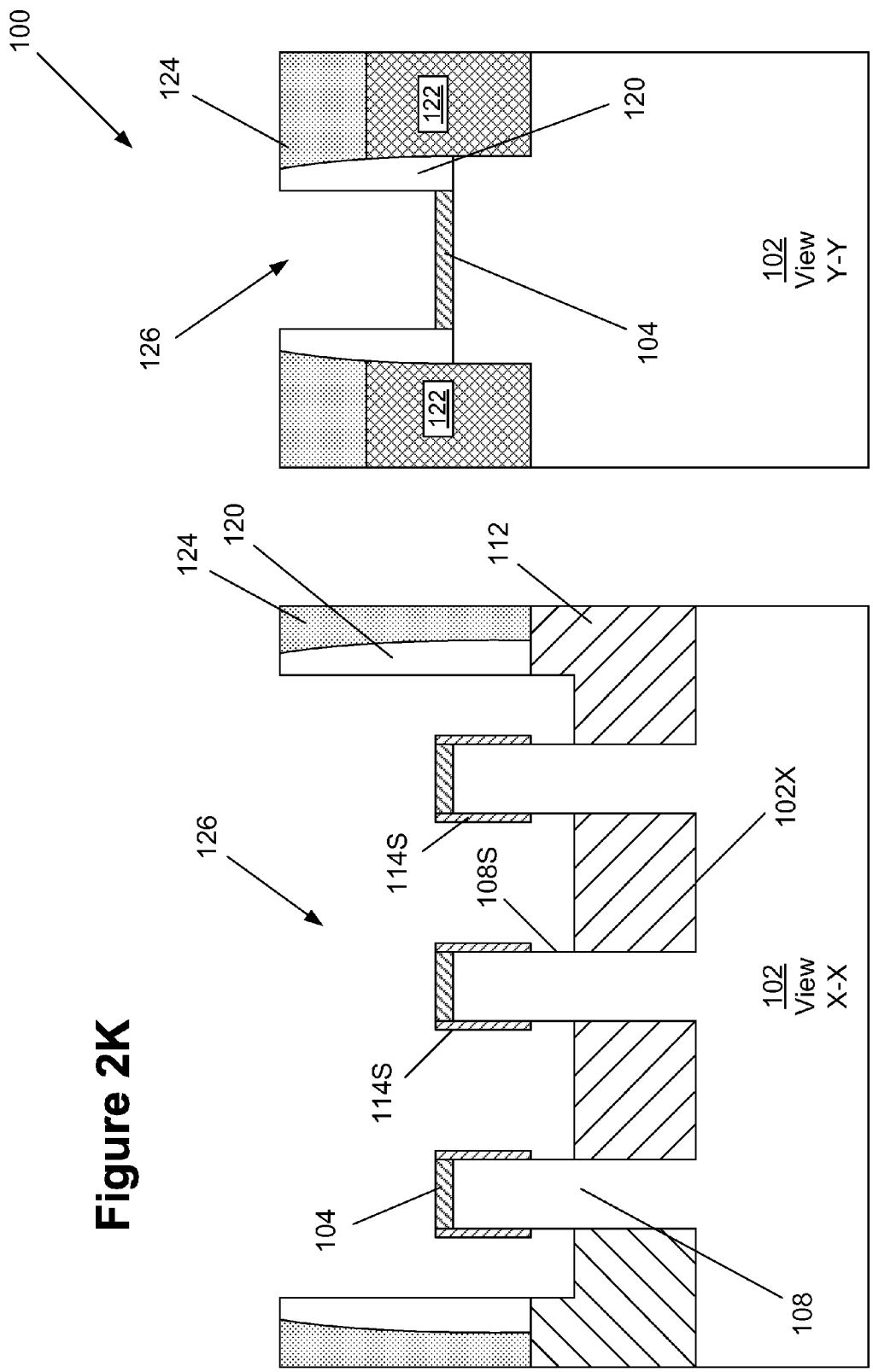

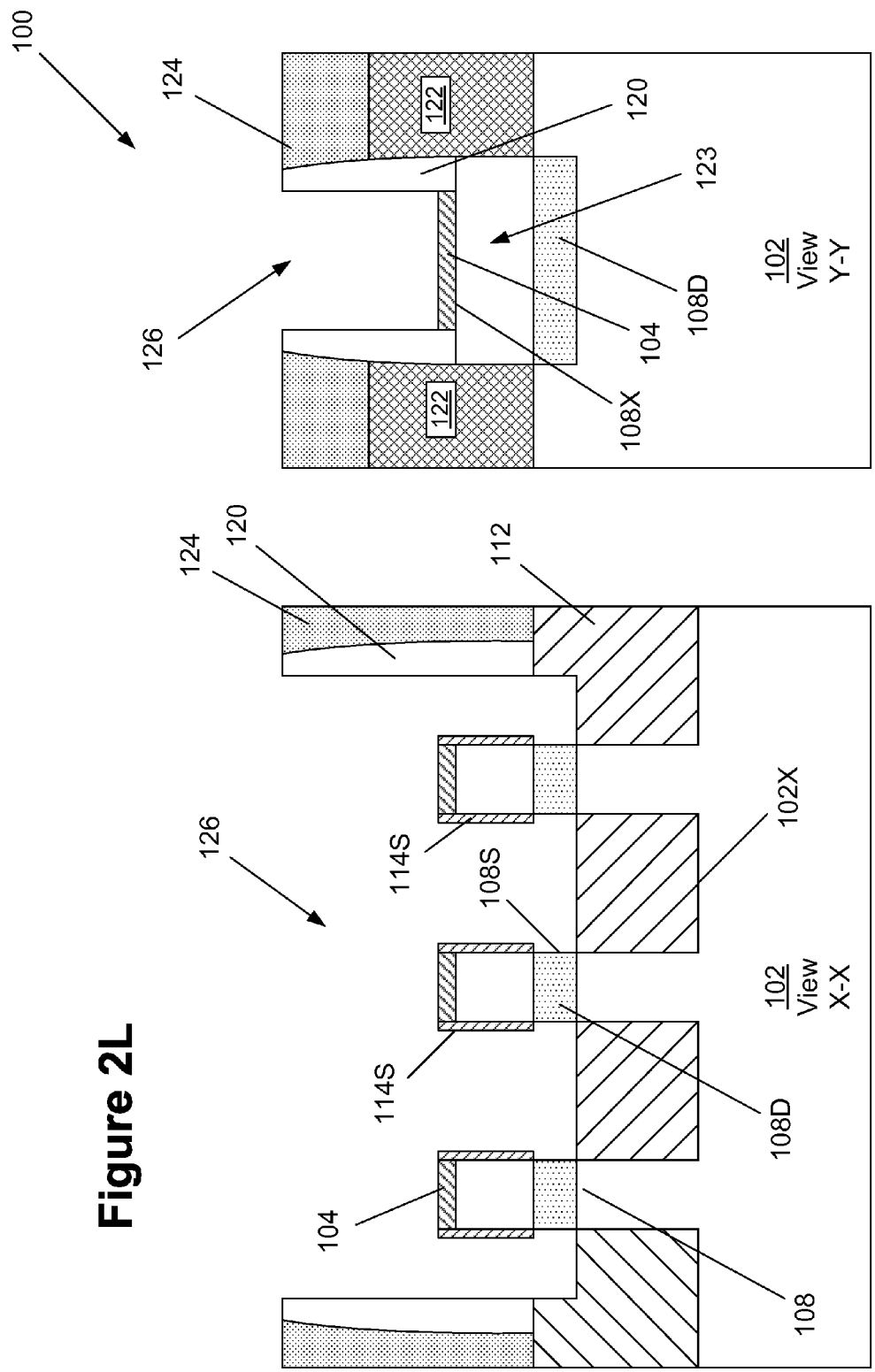

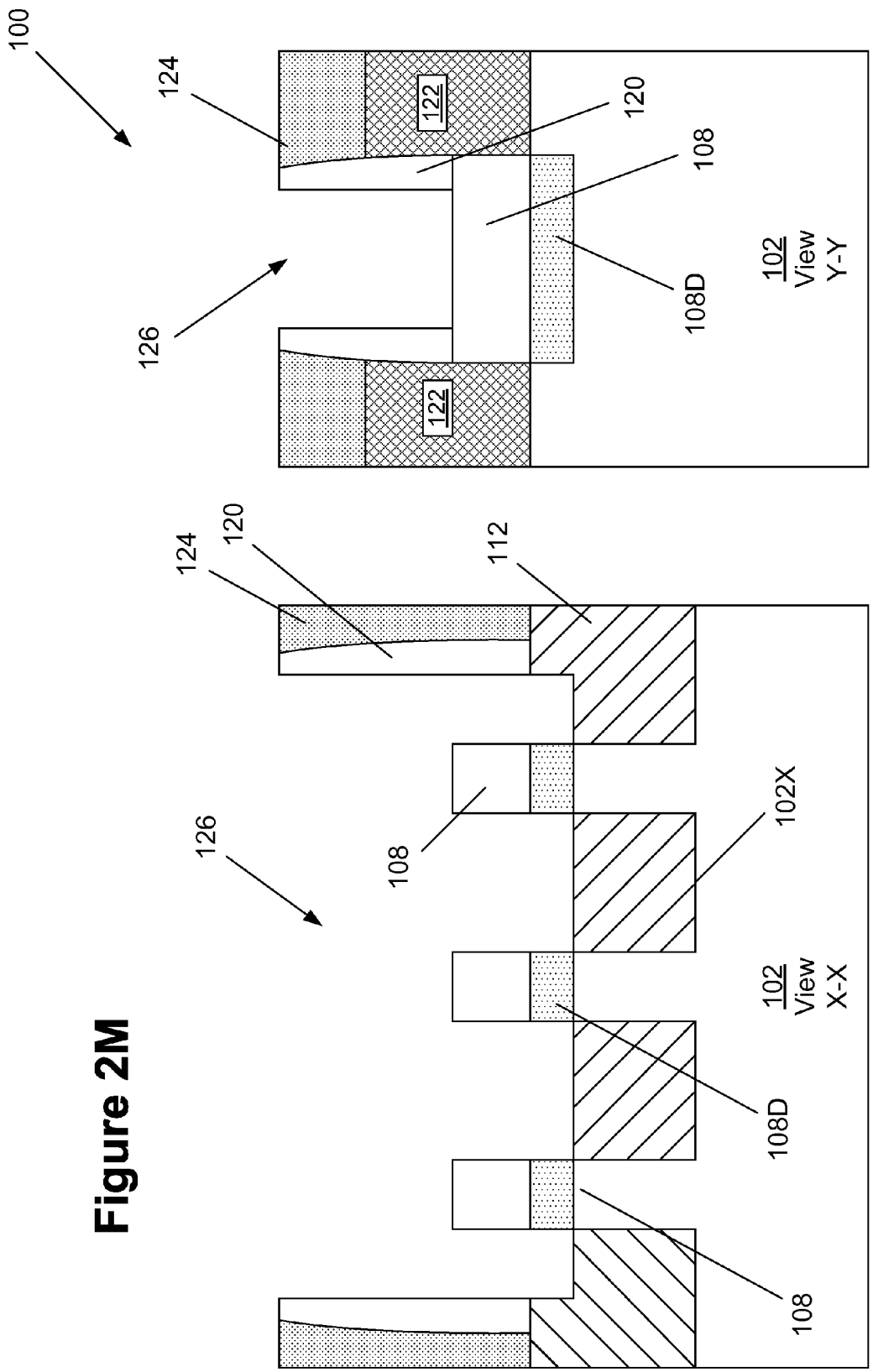

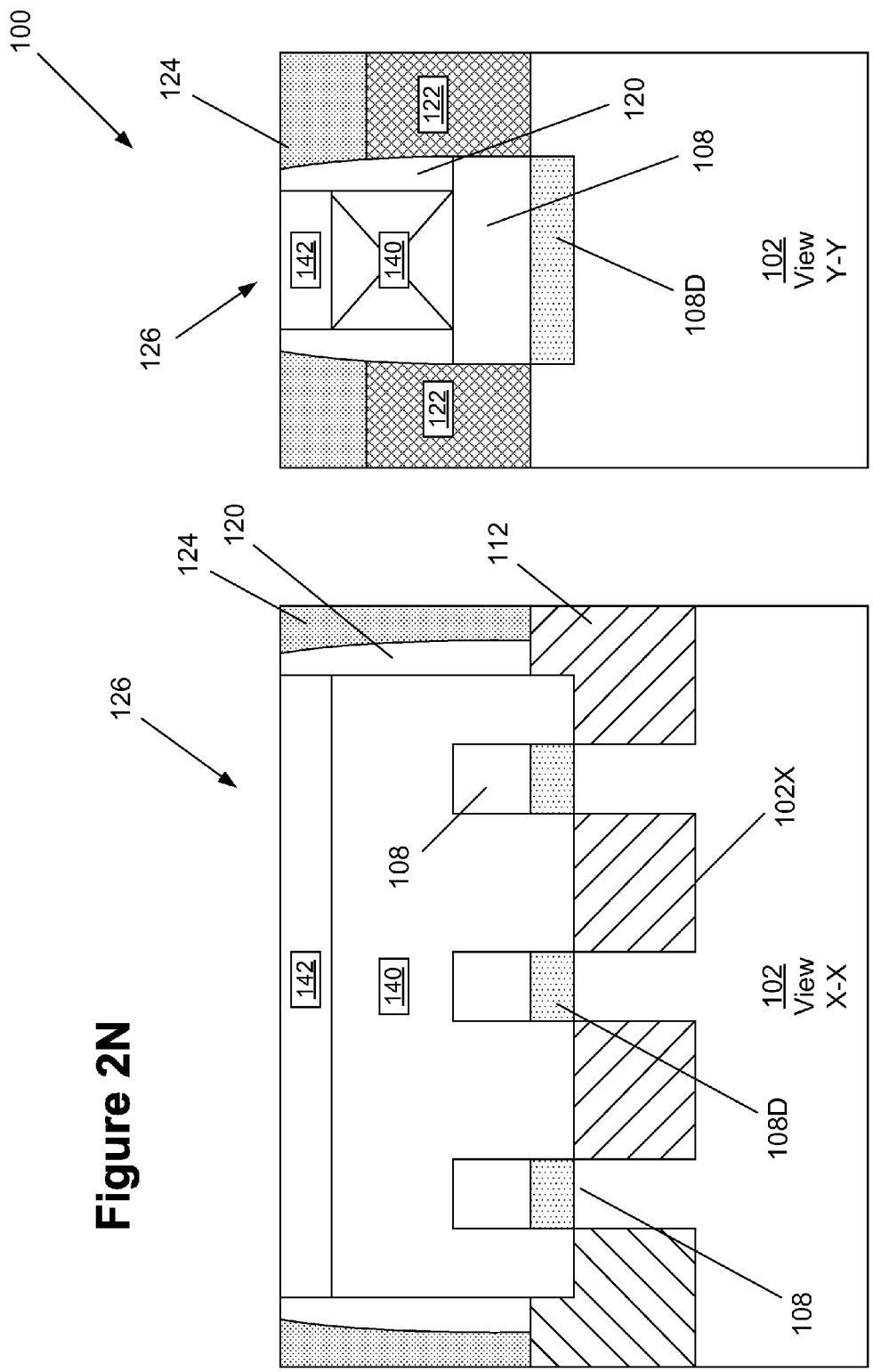

METHODS OF FORMING A FINFET SEMICONDUCTOR DEVICE SO AS TO REDUCE PUNCH-THROUGH LEAKAGE CURRENTS AND THE RESULTING DEVICE

BACKGROUND OF THE INVENTION

1. Field of the Invention

The present disclosure generally relates to the fabrication of integrated circuits, and, more particularly, to various methods of forming a FinFET semiconductor device so as to reduce punch-through leakage currents and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2x) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate-last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconductor substrate 12 in an active area defined by a shallow trench isolation structure 13. At the point of fabrication depicted in FIG. 1B, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

One problem that is encountered in forming FinFET devices relates to preventing leakage currents underneath the fin structures. This is sometimes referred to as so-called "punch-through" leakage currents. One prior art effort to eliminate or reduce such undesirable punch-through leakage currents involved forming counter-doped regions that were positioned at approximately the intersection between the fin and the remaining portion of the substrate. However, obtaining an accurate doping profile that is properly positioned underneath the active fin is very difficult to accomplish, especially given that the additional thermal heating processes that are involved in subsequent process steps will further drive dopant diffusion and make it harder to control the location of the anti-punch-through doping. If dopant diffuses into the fins during subsequent annealing processes, it would cause threshold voltage fluctuation because of the random amount of the dopant diffused into the fins of different devices, which would severely compromise the circuit performance. If a punch-through implant region is formed before the dummy gate structure is formed, there is a good chance that dopant materials will be lost and/or migrate or diffuse to undesirable locations. Trying to form halo implant regions (counter-doped) regions by performing an angled ion implantation process is very difficult given the height of the dummy gate structure and the very small spacing between fins.

Additionally, fabrication of FinFET devices may involve formation of stressed layers of insulation material in an effort to induce a desired stress on the channel region of the FinFET device, e.g., a tensile stress for N-type FinFET devices and a compressive stress for P-type FinFET devices. Such stressed channel regions are formed in an effort to improve the electrical performance characteristics of the N-type and P-type FinFET devices. Thus, an effort at reducing the undesirable punch-through leakage currents must not unduly detract from the benefits achieved by virtue of the formation of the stressed materials that induce the desired stress in the channel region of the FinFET devices.

The present disclosure is directed to various methods of forming a FinFET semiconductor device so as to reduce punch-through leakage currents and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a FinFET semiconductor device so as to reduce punch-through leakage currents and the resulting semiconductor device. One method disclosed includes, among other things, forming a fin in a semiconductor substrate, covering a top surface and a portion of the sidewalls of the fin with etch stop material, after forming the etch stop material, forming a sacrificial gate structure above and around the fin, forming a sidewall spacer adjacent the sacrificial gate structure, performing at least one process operation to remove the sacrificial gate structure and thereby define a replacement gate cavity, wherein the etch stop material remains positioned on the fin while the sacrificial gate structure is removed, with the etch stop material positioned on the fin, performing at least one process operation through the replacement gate cavity to form a counter-doped region in a portion of the fin below an upper surface of the fin and below the channel region of the device, wherein the counter-doped region is doped with a second type of dopant material that is of an opposite type relative to the first type of dopant material, and forming a replacement gate structure in the replacement gate cavity.

Another illustrative method disclosed herein includes, among other things, forming a plurality of trenches in a semiconductor substrate to thereby define a fin, forming a recessed layer of insulating material in the trenches, the recessed layer of insulating material having an upper surface that exposes an upper portion of the fin, covering a top surface and a portion of the sidewalls of the exposed upper portion of the fin with etch stop material, after forming the etch stop material, forming a sacrificial gate structure above the recessed layer of insulating material and around the upper portion of the fin, forming a sidewall spacer adjacent the sacrificial gate structure, after forming the sidewall spacer, performing at least one process operation to remove the sacrificial gate structure and thereby define a replacement gate cavity, wherein the etch stop material remains positioned on the upper portion of the fin while the sacrificial gate structure is removed and wherein the formation of the replacement gate cavity exposes a portion of the recessed layer of insulating material, with the etch stop material positioned on the upper portion of the fin, performing a recess etching process through the replacement gate cavity on the exposed recessed layer of insulating material to further recess the surface of the layer of insulating material and thereby expose portions of the sidewalls of the fin that are not covered by the etch stop material, performing a plasma doping process through the replacement gate cavity to form a counter-doped region in the exposed portions of the sidewalls of the fin that are not covered by the etch stop material, wherein the counter-doped region is doped with a second type of dopant material that is of an opposite type relative to the first type of dopant material and wherein the counter-doped region extends under the entire channel length of the device in the gate-length direction of the device, and forming a replacement gate structure in the replacement gate cavity.

One illustrative device disclosed herein includes, among other things, a fin formed in a semiconductor substrate, a gate structure positioned above the substrate, sidewall spacers positioned adjacent the gate structure and a counter-doped region positioned in the fin below an upper surface of the fin and below the channel region of the device, wherein the counter-doped region is doped with a second type of dopant material that is of an opposite type relative to the first type of dopant material and wherein the counter-doped region extends under the entire channel length of the device in the gate-length direction of the device.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of the transistors using a so-called "replacement gate" technique.

Figure 2A:
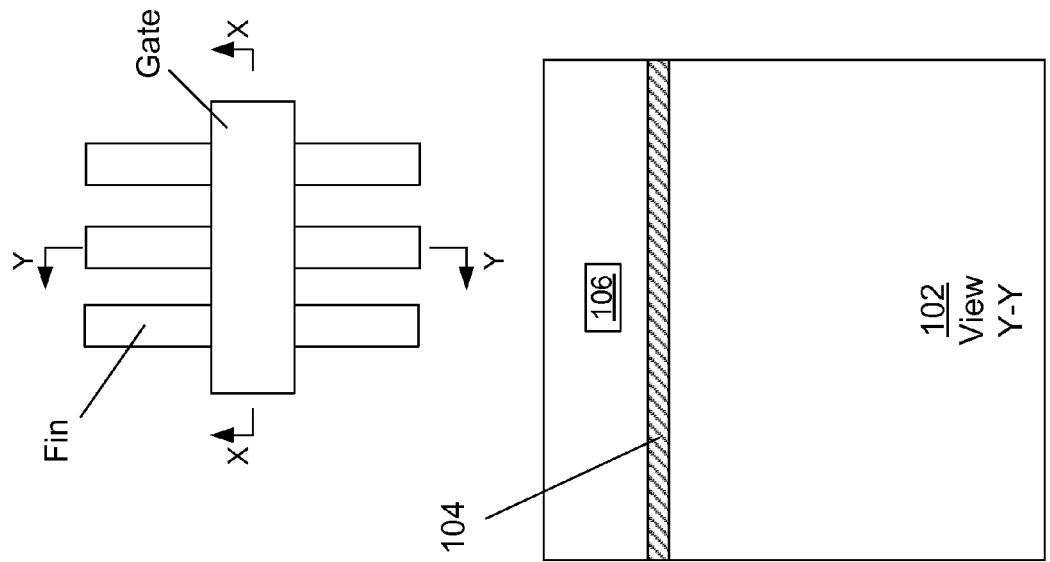
FIGS. 2A-2N depict various illustrative methods disclosed herein of forming a FinFET semiconductor device so as to reduce punch-through leakage currents and the resulting semiconductor device.
Figure 2A:
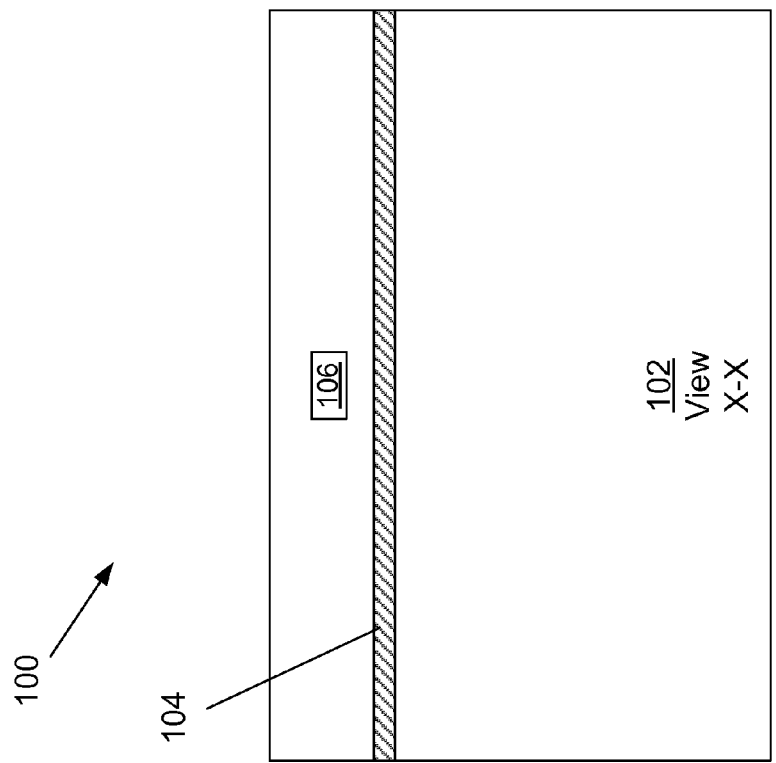

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a FinFET semiconductor device so as to reduce punch-through leakage currents and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. In other embodiments, the device 100 may be formed on a so-called silicon-on-insulator (SOI) substrate, as described more fully below. Thus, the terms "substrate" or "semiconductor substrate" should be understood to cover all semiconducting materials and all forms of such materials.

The attached drawings present various views of one illustrative embodiment of a FinFET device 100 that may be formed using the methods disclosed herein. FIG. 2A contains a simplistic plan view of the device 100 (in the upper right corner) that depicts the location where various cross-sectional views depicted in the following drawings will be taken. More specifically, the view "X-X" is a cross-sectional view that is taken through the gate structure of the device in the gate-width direction, and the view "Y-Y" is a cross-sectional view that is taken through the long axis of the fins of the device (i.e., in the current transport or gate-length direction of the device). The illustrative FinFET device 100 disclosed herein will be depicted as being comprised of three illustrative fins 108. However, as will be recognized by those skilled in the art after a complete reading of the present application, the methods and devices disclosed herein may be employed when manufacturing FinFET devices having any number of fins. The various layers of material depicted in the following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIG. 2A depicts the device 100 at a point in fabrication wherein several process operations have been performed. First, an etch stop layer 104 was deposited above the substrate 102. Next, a hard mask layer 106 was deposited above the etch stop layer 104. In one example, the hard mask layer 106 may be a layer of silicon nitride. In one embodiment, the etch stop layer 104 may be comprised of a high-k material (k value of 10 or greater) such as hafnium oxide. The thickness of the etch stop layer 104 and the hard mask layer 106 may vary depending upon the particular application.

Figure 2B:
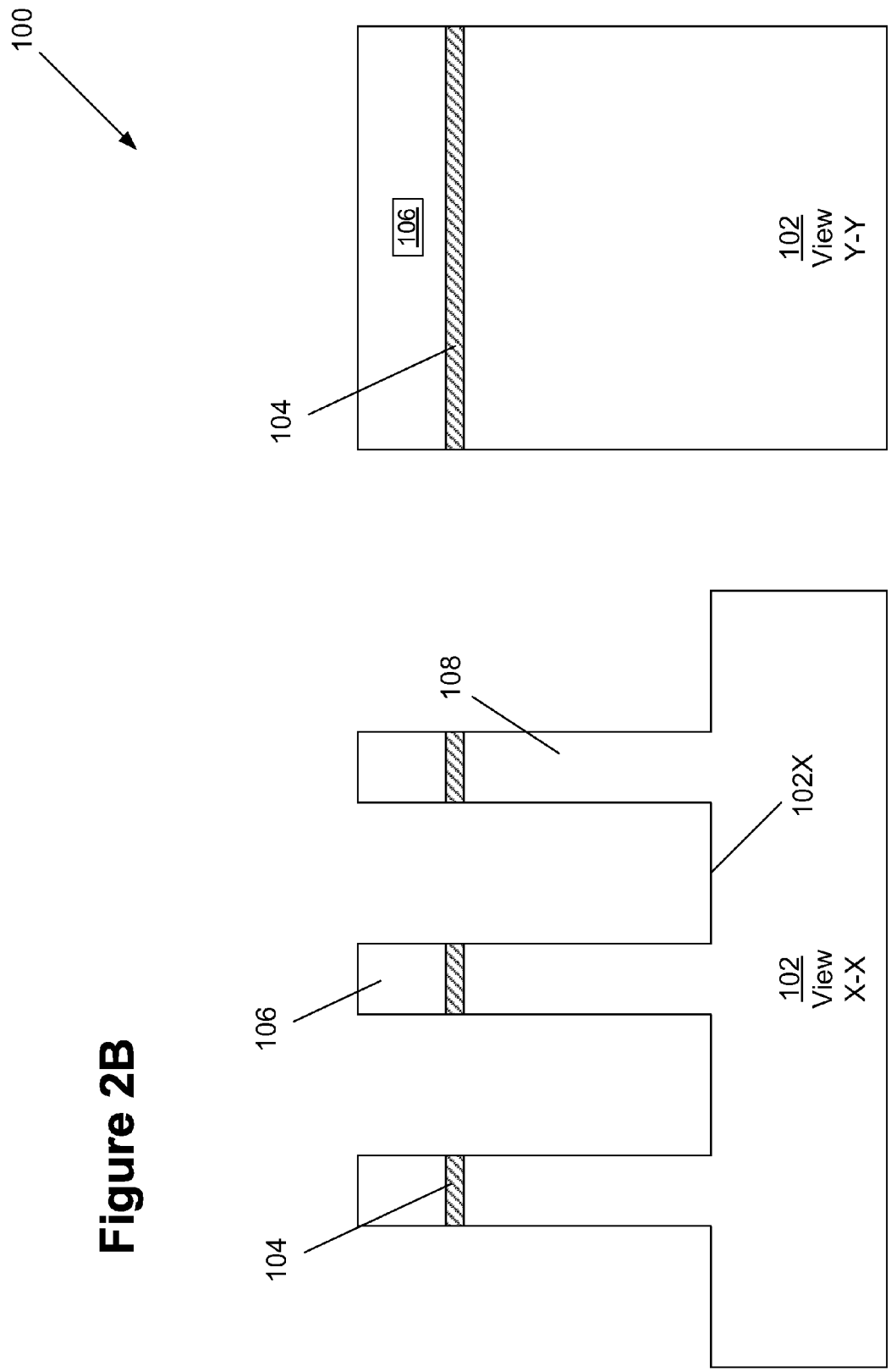

FIG. 2B depicts the device 100 after several additional process operations were performed. First, the hard mask layer 106 and the etch stop layer 104 were patterned using traditional photolithography and etching processes. FIG. 2B depicts the device after the patterned photoresist etch mask was removed. Then, one or more etching processes, e.g., anisotropic etching processes, were performed through the patterned layers 106/104 to define a plurality of fin-formation trenches 102X in the substrate 102. The formation of the fin-formation trenches 102X results in the formation of a plurality of initial fin structures 108. The width and height of the fin structures 108 as well as the depth of the fin-formation trenches 102X may vary depending upon the particular application. Additionally, the overall size, shape and configuration of the fin-formation trenches 102X and fins 108 may vary depending on the particular application. In the illustrative examples depicted in most of the attached drawings, the fin-formation trenches 102X and fins 108 are all depicted as having a uniform size and shape. However, such uniformity in the size and shape of the fin-formation trenches 102X and the fins 108 is not required to practice at least some aspects of the inventions disclosed herein. In the attached figures, the fin-formation trenches 102X are depicted as having been formed by performing an anisotropic etching process that results in the fin-formation trenches 102X having a schematically depicted, generally rectangular configuration. In an actual real-world device, the sidewalls of the fin-formation trenches 102X may be somewhat inwardly tapered, although that configuration is not depicted in the attached drawings. In some cases, the fin-formation trenches 102X may have a reentrant profile (not shown) near the bottom of the fin-formation trenches 102X. To the extent the fin-formation trenches 102X are formed by performing a wet etching process, the fin-formation trenches 102X may tend to have a more rounded configuration or non-linear configuration as compared to the generally rectangular configuration of the fin-formation trenches 102X that are formed by performing an anisotropic etching process. Thus, the size and configuration of the fin-formation trenches 102X, and the manner in which they are made, as well as the general configuration of the fins 108, should not be considered a limitation of the present invention. For ease of disclosure, only the substantially rectangular fin-formation trenches 102X and fins 108 will be depicted in the subsequent drawings.

Figure 2C:
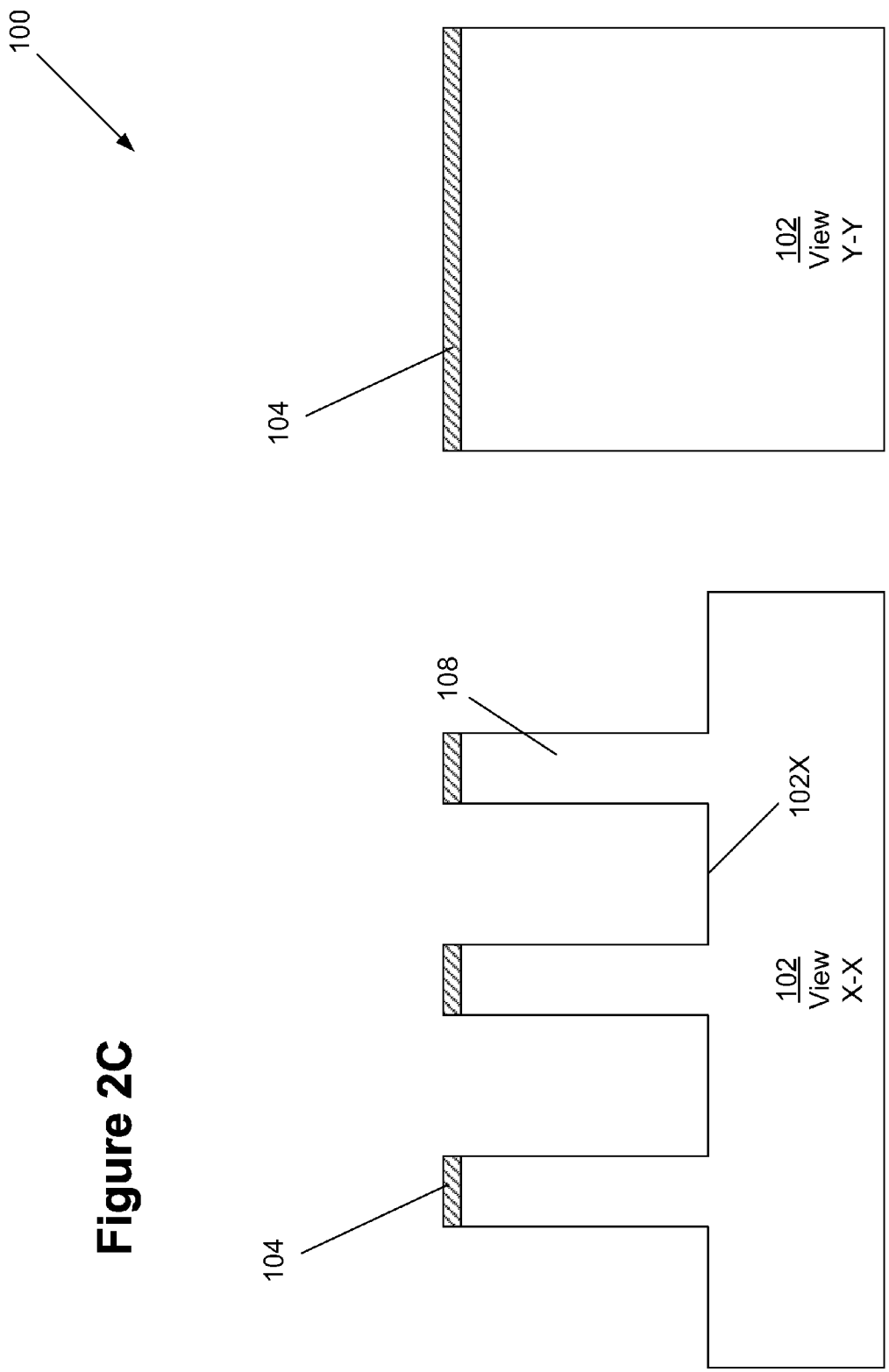

FIG. 2C depicts the device 100 after the hard mask layer 106 was removed from the device selectively relative to the etch stop layer 104.

FIG. 2D depicts the device after a layer of insulating material 112 was blanket-deposited on the device 100, a chemical mechanical polishing (CMP) process was performed on the layer of insulating material using the layer 104 as a polish-stop layer and after a recessing etch-back etching process was performed to recess the layer of insulating material 112 relative to the surrounding materials. This recessing process exposes a portion of the fins 108. In one illustrative example, the layer of insulating material 112 may be a layer of silicon dioxide, an oxygen-rich silicon dioxide, etc., and it may be formed by performing a chemical vapor deposition (CVD) process FIG. 2E depicts the device 100 after another etch stop layer 114 was deposited by performing a conformal deposition process, such as an ALD process. The etch stop layer 114 may be made of the same materials as that of the etch stop layer 104, although such a situation may not be required in all applications. In some cases, the etch stop layer 114 may be made of a material such as silicon nitride, silicon oxynitride, aluminum oxide ($Al_2O_3$), etc. The etch stop layer 114 may be relatively thin, e.g., 2-3 nm.

Figure 2F:
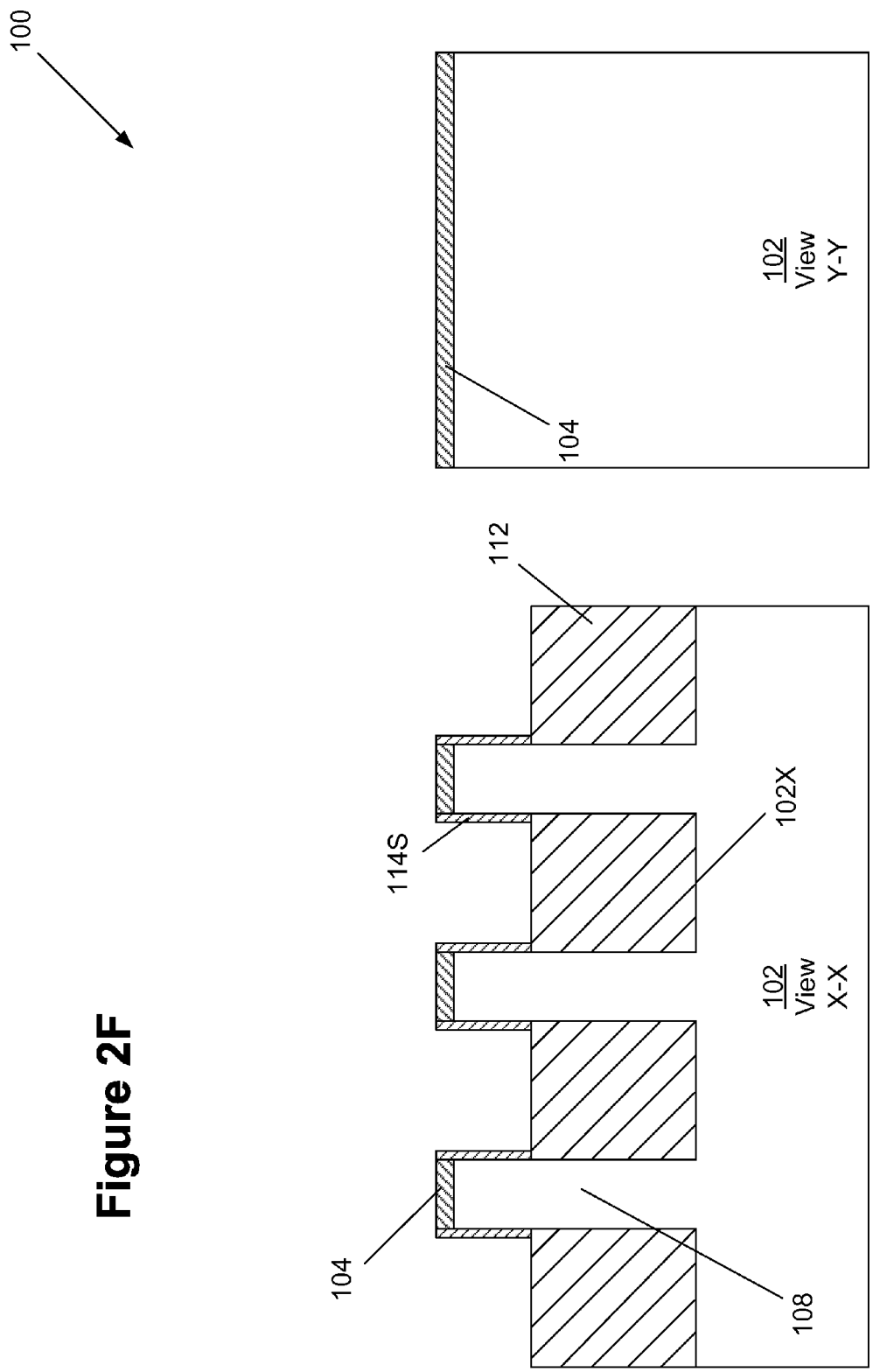

FIG. 2F depicts the device 100 after a timed, anisotropic etching process was performed to remove the horizontally positioned portions of the etch stop layer 114. The etching process results in the formation of protective sidewall spacers 114S on the sidewalls of the fins 108.

Figure 2G:
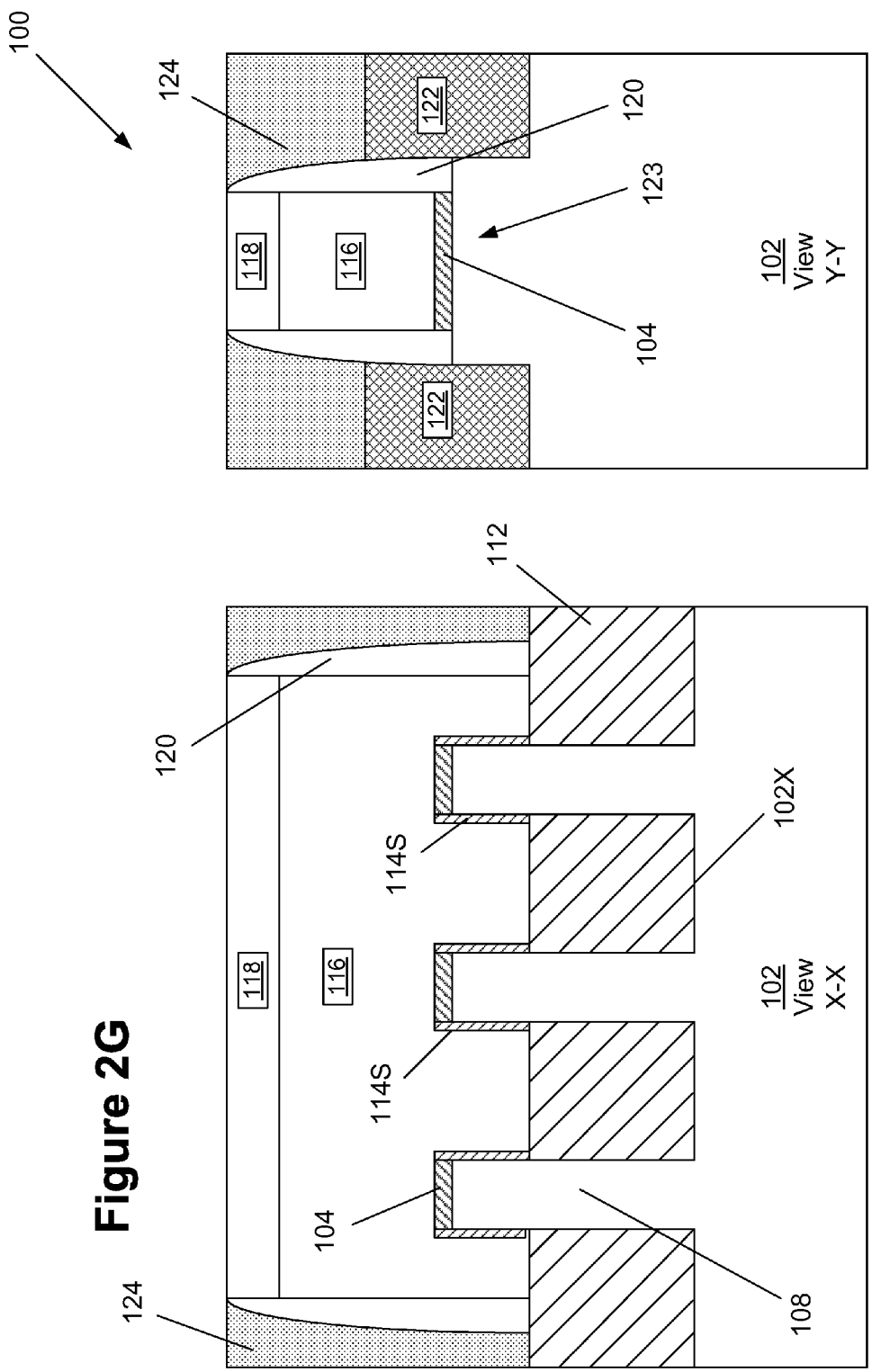

FIG. 2G depicts the device 100 after several process operations were performed. First, an illustrative sacrificial gate structure 116, gate cap layer 118 and sidewall spacers 120 were formed on the device 100. In this example, the sacrificial gate structure 116 includes a dummy or sacrificial gate electrode comprised of, for example, polysilicon or amorphous silicon. The gate cap layer 118 and the sidewall spacers 120 may be comprised of a material such as silicon nitride. The gate structure 116 and the gate cap layer 118 may be formed by depositing the appropriate layer of material on the device and thereafter patterning those materials using traditional photolithography and etching techniques. The etch stop layer 104 may be used as an etch stop during the gate patterning techniques. After gate patterning is done, exposed portions of the etch stop layer 104 may be removed. Then the sidewall spacers 120 may be formed adjacent the gate structure 116. The spacers 120 may be formed by depositing a layer of spacer material and thereafter performing an anisotropic etching process.

With continuing reference to FIG. 2G, after the spacers 120 were formed, the etch stop materials 104, 114 were removed from the fins 108 positioned in the source/drain regions of the device 100, i.e., the etch stop materials 104/114 were removed from the portions of the fins 108 that are positioned laterally outside of the spacers 120. In one illustrative embodiment, an epi semiconductor material 122 may be formed with either a tensile or compressive stress depending upon the type of device (N or P) under construction. In that illustrative situation, the epi semiconductor material 122 imparts a desired stress on the materials in the channel region 123 of the device 100. The epi semiconductor material 122 may be made by performing a traditional epitaxial deposition process. In one illustrative embodiment, the epi semiconductor material 122 may be made of silicon/germanium ($S_xGe_{1-x}$), where the concentration of the germanium may also vary depending upon the particular application. The epi semiconductor material 122 may have a faceted shape of the epi semiconductor material 122 (when viewed in a cross-section taken through the fin in the gate width direction of the device) due to the crystallographic structure of the substrate 102, as well as the orientation of the long axis of the fins 108 on the substrate 102. Of course, the epi semiconductor material 122 need not be formed in the source/drain regions of the device in all applications.

While still referring to FIG. 2G, the next operation involves the formation of a layer of insulating material 124 that was blanket-deposited on the device 100. In one illustrative example, the layer of insulating material 124 may be a layer of silicon dioxide, an oxygen-rich silicon dioxide, etc., and it may be formed by performing a chemical vapor deposition (CVD) process. Thereafter, a chemical mechanical polishing (CMP) process was performed using the gate cap layer 118 as a polish stop layer.

FIG. 2H depicts the device 100 after a CMP process was performed to remove the gate cap layer 118 and thereby expose the sacrificial gate structure 116 for removal.

Figure 2I:
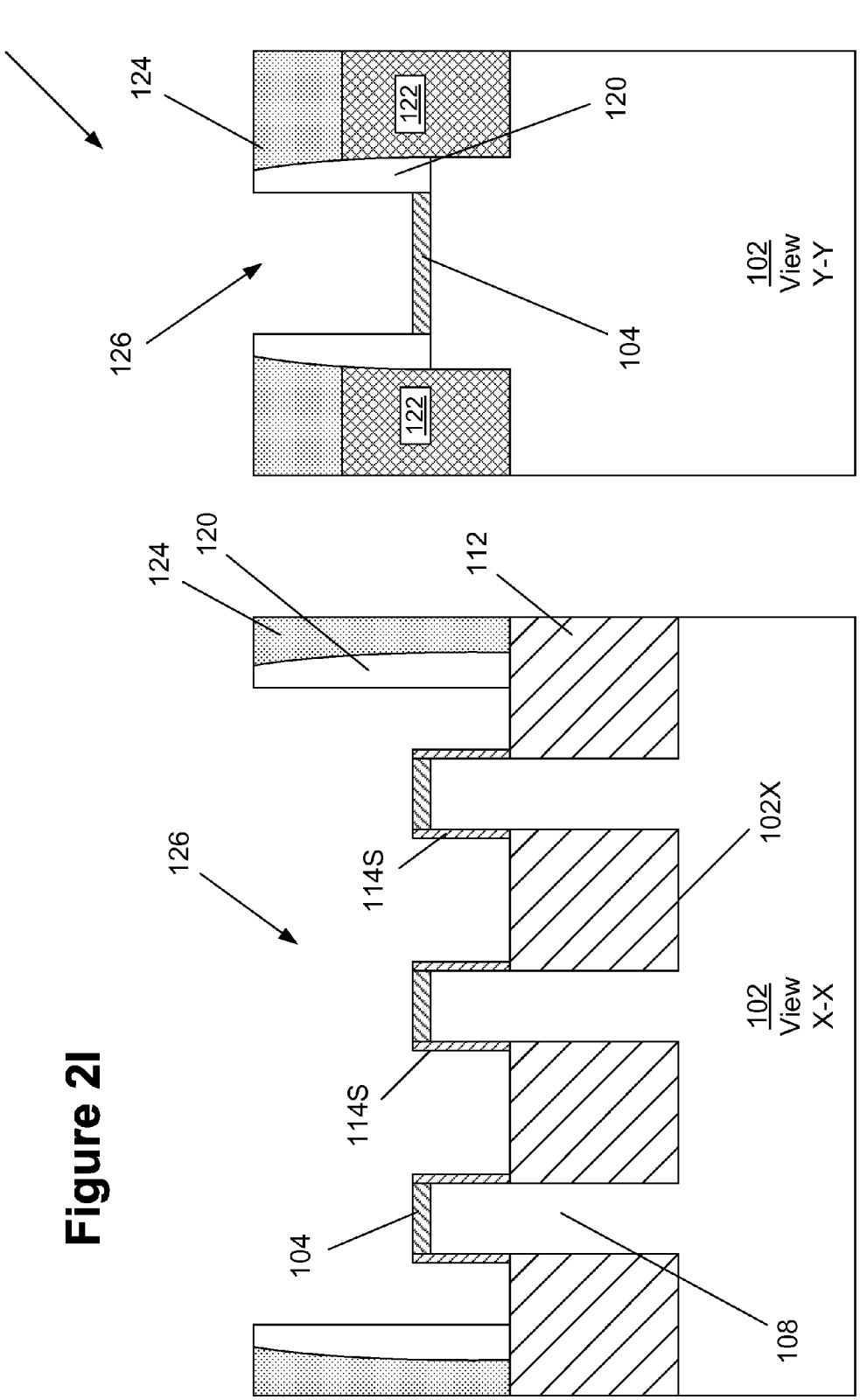

FIG. 2I depicts the device 100 after one or more etching processes were performed to remove the sacrificial gate structure 116 and thereby define a replacement gate cavity 126 where a replacement gate structure will eventually be formed for the device 100. During this etching process, the etch stop layer 104 within the gate cavity 126 may serve as an etch stop layer.

Figure 2J:
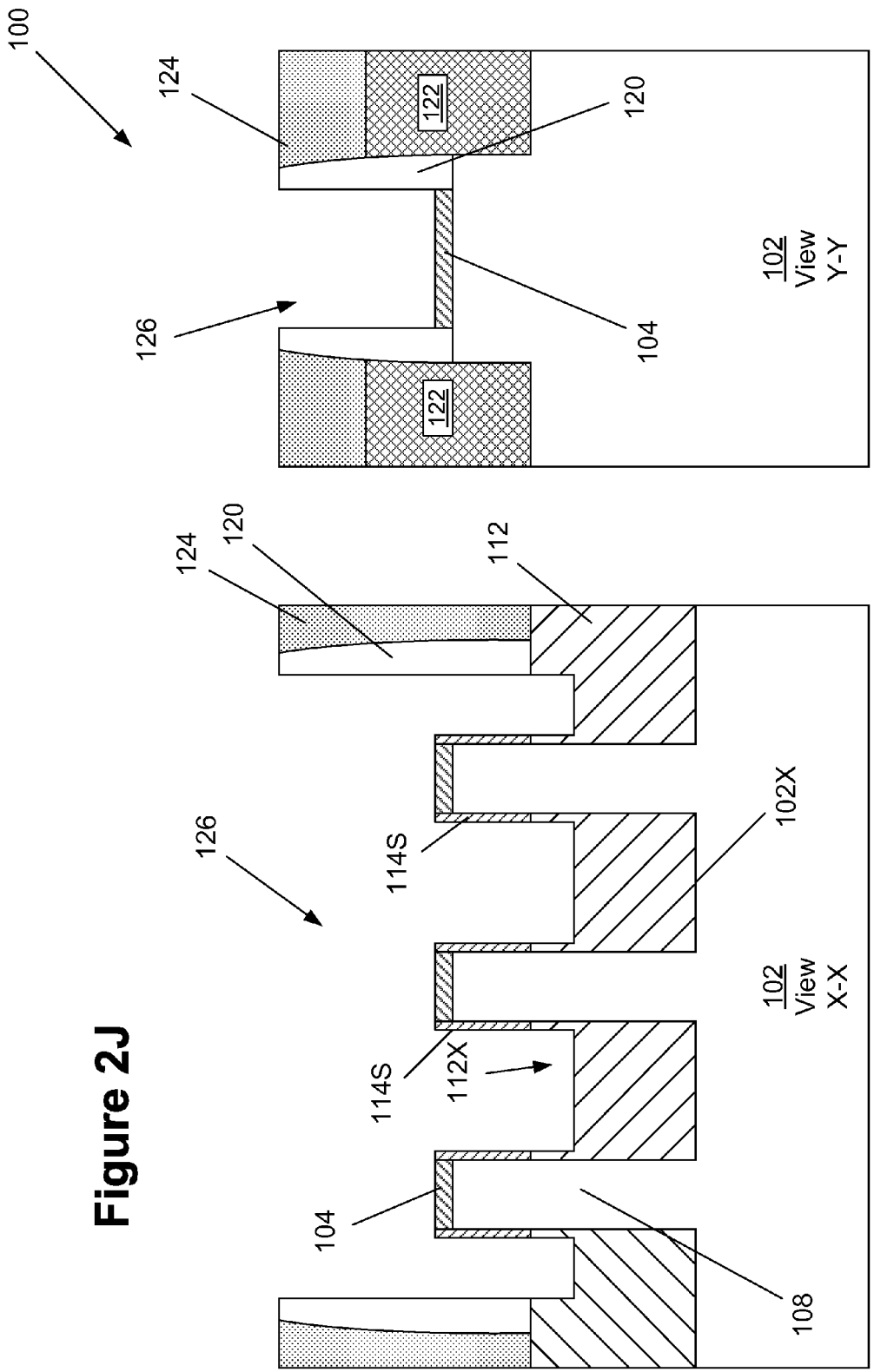

FIG. 2J depicts the device 100 after a timed, anisotropic, recessing etch-back process was performed on the layer of insulating material 112 to define recesses 112X in the layer of insulating material 112. The depth of the recesses 112X may vary depending upon the particular application, e.g., 10-25 nm.

FIG. 2K depicts the device 100 after an isotropic etching process was performed to remove any residual portions of the layer of insulating material 112 that are positioned on the sidewalls 108S of the fins 108. This etching process exposes portions of the sidewalls 108S of the initial fin structures 108 for further processing.

FIG. 2L depicts the device 100 after counter-doped regions 108D were formed in the portions of the fins 108 that are positioned under the gate cavity 126, i.e., under the channel region 123 of the device 100. For N-type devices 100, the doped region 108D will be doped with a P-type dopant material. Conversely, for P-type devices, the doped region 108D will be doped with an N-type dopant material. In one illustrative embodiment, a plasma doping process is performed to form the doped regions 108D in the exposed sidewall portions of the fins 108 within the cavity 126. As an example, the plasma doping process may be performed as described in a prior art paper entitled "Conformal Doping of FinFETs and Precise Controllable Shallow Doping for Planar FET Manufacturing by a Novel $B_2/H_6$/Helium Self-Regulatory Plasma Doping Process," by Sasaki et. al., which is hereby incorporated by reference in its entirety. Ultimately, the doped regions 108D may have a dopant concentration of at least about $1\ e^{18}$ ions/cm$^3$. After the doped regions 108D are formed, and after the subsequent formation of a high-k gate insulation layer (see FIG. 2N below), a heat treatment process may be performed to activate the dopant materials and to repair any damage to the lattice structure of the fins 108 and to improve the reliability of the high-k gate insulation layer. In one illustrative embodiment, such a heat treatment process may be a rapid thermal anneal process performed at a temperature that falls within the range of about 900-1000° C. for a duration of about 5-30 seconds. Note that, during this heat treatment process, the dopant materials will tend to migrate, although such dopant migration is not depicted in the attached drawings. Importantly, due to the depth of the counter-doped regions 108D below the surface 108X of the fins 108, i.e., the vertical separation between the upper surface 108X and the top of the doped regions 108D, the doped regions 108D serve to reduce leakage currents and act as an efficient channel stop region. However, using the methods disclosed herein, the amount of dopant diffusion will be less than that associated with prior art techniques since thermal processing steps have been reduced.

FIG. 2M depicts the device 100 after one or more etching processes were performed through the cavity 126 to remove any residual portions of the etch stop layers 104, 114 so as to thereby clear the exposed final fin structure 108 of any unwanted materials.

FIG. 2N depicts the device 100 after several process operations were performed. First, several known processing operations were performed to form a schematically depicted replacement gate structure 140 in the gate cavity 126. The replacement gate structure 140 depicted herein is intended to be representative in nature of any type of gate structure that may be employed in manufacturing integrated circuit products using so-called gate-last (replacement gate) manufacturing techniques. The replacement gate structure 140 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. After the various layers of material that will be present in the replacement gate structure 140 are sequentially deposited in the gate cavity 126, one or more CMP processes are performed to remove excess portions of the gate materials positioned outside of the gate cavity 126 and above the layer of insulating material 124, as described in the background section of this application. Then, one or more etching processes were performed to remove upper portions of the various materials within the cavity 126 so as to form the replacement gate structure 140 and to form a recess above the replacement gate structure 140. Then, a gate cap 142 was formed in the recess above the recessed gate materials. The gate cap 142 is typically comprised of silicon nitride and it may be formed by depositing a layer of gate cap material so as to over-fill the recess formed in the gate cavity 126 above the replacement gate structure 140 and thereafter performing a CMP process to remove excess portions of the gate cap material layer positioned above the surface of the layer of insulating material 124. The gate cap 142 is formed so as to protect the underlying gate materials during subsequent processing operations. At this point, traditional manufacturing operations may be performed to complete the fabrication of the illustrative FinFET device 100, e.g., contact formation, formation of metallization layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device comprised of source/drain regions doped with a first type of dopant material and a channel region, the method comprising:
    forming a fin in a semiconductor substrate, said fin having sidewalls;
    covering a top surface and a portion of said sidewalls of said fin with etch stop material;
    after forming said etch stop material, forming a sacrificial gate structure above and around said fin;
    forming a sidewall spacer adjacent said sacrificial gate structure;
    performing at least one process operation to remove said sacrificial gate structure and thereby define a replacement gate cavity, wherein said etch stop material remains positioned on said fin while said sacrificial gate structure is removed;
    with said etch stop material positioned on said fin, performing at least one process operation through said replacement gate cavity to form a counter-doped region in a portion of said fin below an upper surface of said fin and below said channel region of said device, wherein said counter-doped region is doped with a second type of dopant material that is of an opposite type relative to said first type of dopant material; and
    forming a replacement gate structure in said replacement gate cavity.

2. The method of claim 1, wherein said first type of dopant material is an N-type dopant material and said second type of dopant material is a P-type dopant material.

3. The method of claim 1, wherein said first type of dopant material is a P-type dopant material and said second type of dopant material is an N-type dopant material.

4. The method of claim 1, wherein performing said at least one process operation through said replacement gate cavity to form said counter-doped region in said fin below said upper surface of said fin and below said channel region of said device comprises performing a plasma doping process to form said counter-doped region.

5. The method of claim 4, further comprising performing a heat treatment process at a temperature that falls within the range of about 900-1000° C. for a duration of about 5-30 seconds.

6. The method of claim 1, wherein said counter-doped region has a dopant concentration of at least about $1\ e^{18}$ ions/cm$^3$ of said second type of dopant material.

7. The method of claim 1, wherein said replacement gate structure comprises a gate insulation layer comprised of a high-k insulating material and a gate electrode comprised of at least one layer of metal.

8. The method of claim 1, wherein said counter-doped region extends under the entire channel length of said device in the gate-length direction of said device.

9. The method of claim 1, wherein, after forming said sidewall spacer and prior to removing said sacrificial gate structure, the method further comprises performing an epitaxial deposition process to form an epi semiconductor material that is positioned on the portions of said fin in said source/drain regions of said device.

10. The method of claim 9, wherein said counter-doped region contacts said epi semiconductor material positioned above both of said source/drain regions of said device.

11. The method of claim 1, wherein covering said top surface and said portion of said sidewalls of said fin with said etch stop material comprises performing two separate deposition processes.

12. The method of claim 1, wherein performing said at least one process operation to remove said sacrificial gate structure exposes an isolation material positioned adjacent said sidewalls of said fin.

13. The method of claim 12, wherein, prior to performing said at least one process operation through said replacement gate cavity to form said counter-doped region in said portion of said fin, the method comprises performing a recess etching process through said replacement gate cavity on said exposed isolation material with said etch stop material in position on said fin to recess the surface of said isolation material and thereby expose portions of said sidewalls of said fin that are not covered by said etch stop material.

14. The method of claim 12, wherein said counter-doped region is formed in said exposed portions of said sidewalls of said fin that are not covered by said etch stop material.

15. A method of forming a FinFET device comprised of source/drain regions doped with a first type of dopant material and a channel region, the method comprising:
forming a plurality of trenches in a semiconductor substrate to thereby define a fin, said fin having sidewalls;
forming a recessed layer of insulating material in said trenches, said recessed layer of insulating material having an upper surface that exposes an upper portion of said fin;
covering a top surface and a portion of said sidewalls of said exposed upper portion of said fin with etch stop material;
after forming said etch stop material, forming a sacrificial gate structure above said recessed layer of insulating material and around said upper portion of said fin;
forming a sidewall spacer adjacent said sacrificial gate structure;
after forming said sidewall spacer, performing at least one process operation to remove said sacrificial gate structure and thereby define a replacement gate cavity, wherein said etch stop material remains positioned on said upper portion of said fin while said sacrificial gate structure is removed and wherein the formation of said replacement gate cavity exposes a portion of said recessed layer of insulating material;
with said etch stop material positioned on said upper portion of said fin, performing a recess etching process through said replacement gate cavity on said exposed recessed layer of insulating material to further recess the surface of said layer of insulating material and thereby expose portions of said sidewalls of said fin that are not covered by said etch stop material;
performing a plasma doping process through said replacement gate cavity to form a counter-doped region in said exposed portions of said sidewalls of said fin that are not covered by said etch stop material, wherein said counter-doped region is doped with a second type of dopant material that is of an opposite type relative to said first type of dopant material and wherein said counter-doped region extends under the entire channel length of said device in the gate-length direction of said device; and
forming a replacement gate structure in said replacement gate cavity.

16. The method of claim 15, further comprising performing a heat treatment process at a temperature that falls within the range of about 900-1000° C. for a duration of about 5-30 seconds.

17. The method of claim 15, wherein said counter-doped region has a dopant concentration of at least about $1\ e^{18}$ ions/cm$^3$ of said second type of dopant material.

18. The method of claim 15, wherein after forming said sidewall spacer and prior to removing said sacrificial gate structure, the method further comprises performing an epitaxial deposition process to form an epi semiconductor material that is positioned on the portions of said fin in said source/drain regions of said device.

19. The method of claim 18, wherein said counter-doped region contacts said epi semiconductor material positioned above both of said source/drain regions of said device.

20. A FinFET device comprised of source/drain regions doped with a first type of dopant material and a channel region, comprising:
a fin formed in a semiconductor substrate;
a gate structure positioned above said substrate;
sidewall spacers positioned adjacent said gate structure; and
a counter-doped region in said fin below an upper surface of said fin and below said channel region of said device, wherein said counter-doped region is doped with a second type of dopant material that is of an opposite type relative to said first type of dopant material and wherein said counter-doped region extends under the entire channel length of said device in the gate-length direction of said device.

21. The device of claim 20, wherein said first type of dopant material is an N-type dopant material and said second type of dopant material is a P-type dopant material.

22. The device of claim 20, wherein said first type of dopant material is a P-type dopant material and said second type of dopant material is an N-type dopant material.

23. The device of claim 20, wherein said counter-doped region has a dopant concentration of at least about $1\ e^{18}$ ions/cm$^3$ of said second type of dopant material.

24. The device of claim 20, wherein said gate structure comprises a gate insulation layer comprised of a high-k insulating material and a gate electrode comprised of at least one layer of metal.

25. The device of claim 20, wherein said device further comprises an epi semiconductor material positioned on the portions of said fin in said source/drain regions of said device.

26. The device of claim 25, wherein said counter-doped region contacts said epi semiconductor material positioned above both of said source/drain regions of said device.

* * * * *